(12) United States Patent
Joo et al.

(10) Patent No.: US 6,541,355 B2
(45) Date of Patent: Apr. 1, 2003

(54) METHOD OF SELECTIVE EPITAXIAL GROWTH FOR SEMICONDUCTOR DEVICES

(75) Inventors: Sung Jae Joo, Kyoungki-do (KR); Chang Woo Ryoo, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/034,392

(22) Filed: Dec. 28, 2001

(65) Prior Publication Data

US 2003/0045075 A1 Mar. 6, 2003

(30) Foreign Application Priority Data

Sep. 5, 2001 (KR) ........................ 2001-54514

(51) Int. Cl.$^7$ .................... H01L 21/20; H01L 21/36
(52) U.S. Cl. .................. 438/479; 438/416; 438/429; 438/481
(58) Field of Search ............... 438/429, 413, 438/416, 479, 481

(56) References Cited

U.S. PATENT DOCUMENTS

| | | | | |
|---|---|---|---|---|
| 4,058,430 A | * | 11/1977 | Suntola et al. | 156/611 |
| 4,882,294 A | * | 11/1989 | Christenson | 437/90 |
| 5,073,516 A | | 12/1991 | Moslehi | |
| 5,273,921 A | | 12/1993 | Neudeck et al. | |
| 5,294,286 A | * | 3/1994 | Nishizawa et al. | 156/610 |
| 5,321,306 A | | 6/1994 | Choi et al. | |
| 5,423,286 A | * | 6/1995 | Yonehara et al. | 117/94 |
| 5,434,092 A | | 7/1995 | Neudeck et al. | |
| 5,604,368 A | | 2/1997 | Taur et al. | |
| 5,804,470 A | | 9/1998 | Wollesen | |
| 5,895,948 A | | 4/1999 | Mori et al. | |
| 5,955,759 A | | 9/1999 | Ismail et al. | |
| 5,963,822 A | * | 10/1999 | Saihara et al. | 438/481 |
| 6,030,891 A | | 2/2000 | Tran et al. | |
| 6,030,894 A | | 2/2000 | Hada et al. | |
| 6,090,691 A | | 7/2000 | Ang et al. | |
| 6,150,190 A | | 11/2000 | Stankus et al. | |

FOREIGN PATENT DOCUMENTS

| | | | |
|---|---|---|---|
| JP | 59082768 | 5/1984 | |
| JP | 59165461 | 9/1984 | |
| JP | 59165462 | 9/1984 | |
| JP | 59165463 | 9/1984 | |
| JP | 59165464 | 9/1984 | |
| JP | 59165465 | 9/1984 | |
| JP | 59189677 | 10/1984 | |
| JP | 61006195 | 1/1986 | |
| JP | 63164355 | 7/1988 | |
| JP | 02130919 | 5/1990 | |
| JP | 02-130919 * | 5/1990 | ........... H01L/21/28 |
| JP | 07130682 | 5/1995 | |
| JP | 10107219 | 4/1998 | |

* cited by examiner

Primary Examiner—Alexander Ghyka
(74) Attorney, Agent, or Firm—Ladas & Parry

(57) ABSTRACT

A method of selective epitaxial growth for a semiconductor device is disclosed. By employing a hydrogen gas as a selectivity promoting gas in addition to a chlorine gas conventionally used, the method can guarantee the selectivity of epitaxial growth and further increase the growth rate of an epitaxial layer. The method begins with loading a semiconductor substrate into a reaction chamber. The substrate has a mask layer, which is selectively formed thereon to define a first portion exposed beyond the mask layer and a second portion covered by the mask layer. Next, a source gas is supplied into the reaction chamber so that the source gas is adsorbed on the first portion and thus the epitaxial layer is selectively formed on the first portion. Then, the selectivity promoting gas including the $H_2$ gas into the reaction chamber, whereby any nucleus of semiconductor material is removed from the mask layer. Thereafter, the source gas and the selectivity promoting gas are sequentially and repeatedly supplied until the semiconductor epitaxial layer is grown to a desired thickness.

10 Claims, 5 Drawing Sheets

METHOD OF SELECTIVE EPITAXIAL GROWTH FOR SEMICONDUCTOR DEVICES

BACKGROUND OF THE INVENTION

1. Field of the Invention

The present invention relates generally to a method of fabricating a semiconductor device. More particularly, the present invention relates to a method of selective epitaxial growth (SEG) having improved selectivity.

2. Description of the Prior Art

Typical selective epitaxial growth is a useful technology applied to selectively grow a homogeneous or heterogeneous semiconductor layer on only an exposed semiconductor surface, and omitting epitaxial growth over a masked surface on an insulating layer, such as an oxide layer or a nitride layer.

Recently, various ways to obtain selective epitaxial growth of silicon or silicon germanium have been introduced in the art. Among them, an ultrahigh vacuum chemical vapor deposition (UHVCVD) technique has attracted considerable attention because it enables selective epitaxial growth at a low temperature, often at less than 800° C. The UHVCVD technique employs mostly $SiH_4$, $Si_2H_6$, $GeH_4$ or $Ge_2H_6$ as a source gas, and $Cl_2$ as a selectivity promoting gas.

On the other hand, the selective epitaxial growth technology is classified into either of two types, conventional growth and cyclical growth.

Conventional growth is a technique to grow an epitaxial silicon layer or an epitaxial silicon germanium layer by simultaneously supplying a source gas, such as $SiH_4$, $Si_2H_6$, $GeH_4$ and $Ge_2H_6$, and $Cl_2$ gas into a reactor.

Cyclical growth is a technique to alternatively supply the source gas and $Cl_2$ gas at alternating times in the manner shown in FIG. 1. Here, $Cl_2$ gas serves to prevent the nucleus generation of polysilicon or silicon germanium on surfaces of the insulating layer due to either etching action or surface passivation.

Therefore, as illustrated in FIG. 2, the increase in a flow rate of $Cl_2$ gas generally improves the selectivity of epitaxial growth.

Nevertheless, a high flow rate of $Cl_2$ gas during selective epitaxial growth not only reduces the growth rate of the epitaxial layer, as depicted in FIG. 3, but also detrimentally affects the expected life span of the processing facilities. For at least the above reasons, there is a need to minimize the use of $Cl_2$ gas.

After using a conventional method of selective epitaxial growth, a photograph of FIG. 4 shows an experimental result under conditions of $Si_2H_6$ source gas supplied with a flow rate of 10 sccm for about ten seconds in a first step and then $Cl_2$ gas supplied with a flow rate of 2 sccm for about twelve seconds in a second step. Here the epitaxial growth is made on a semiconductor substrate having a nitride layer at a temperature of about 750° C.

As shown in FIG. 4, a polysilicon layer is grown on the nitride layer; therefore the desired selectivity is not obtained. That is, since the nucleus of polysilicon or silicon germanium is generated first of all at a defective site on the surface of the insulating layer during a low temperature epitaxial growth less than 800° C., the epitaxial growth is not selective.

SUMMARY OF THE INVENTION

It is therefore an object of the present invention to provide a method of selective epitaxial growth for a semiconductor device, capable of guaranteeing selectivity of the epitaxial growth and further preventing degradation of a gate oxide layer.

Another object of the present invention is to provide a method of selective epitaxial growth for a semiconductor device, allowing an improvement in productivity by increasing the growth rate of the epitaxial layer.

These and other objects in accordance with the present invention are attained by a method of selective epitaxial growth for a semiconductor device, the method comprising the steps of loading a semiconductor substrate into a reaction chamber, wherein a mask layer is selectively formed on the semiconductor substrate to define a first portion exposed beyond the mask layer and a second portion covered with the mask layer; supplying a source gas into the reaction chamber so that the source gas is adsorbed on the first portion of the semiconductor substrate and thus a semiconductor epitaxial layer is selectively formed on the first portion; supplying a selectivity promoting gas, including $H_2$ gas, into the reaction chamber, whereby any nucleus of semiconductor material is removed from the surface of the mask layer of the semiconductor substrate and thus selectivity of the semiconductor epitaxial layer is improved; and sequentially repeating the steps of supplying the source gas and the selectivity promoting gas, whereby the semiconductor epitaxial layer is grown to a desired thickness.

DETAILED DESCRIPTION OF THE INVENTION

The present invention will be now described more fully hereinafter with reference to accompanying drawings, in which preferred embodiments of the invention are shown. This invention may, however, be embodied in many different forms and should not be construed as limited to the embodiments set forth herein; rather, these embodiments are provided for illustrative purposes so that this disclosure will be thorough and complete, and will fully convey the scope of the invention to those skilled in the art.

When cyclic growth technology is used as the selective epitaxial growth technology of silicon or silicon germanium using the existing ultrahigh vacuum chemical vapor deposition (UHVCVD) technique, a method proposed by the present invention not only can guarantee the selectivity of the epitaxial growth, but also can increase the growth rate by employing a hydrogen gas as a selectivity promoting gas in addition to the conventionally used chlorine gas.

Figure 1:
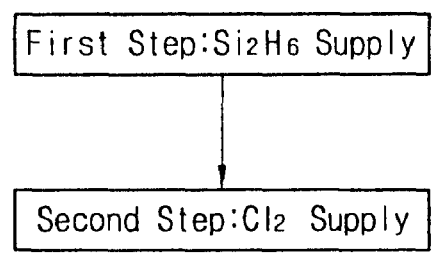
FIG. 1 is a flow chart for schematically illustrating the steps of a conventional method of selective epitaxial growth.
Figure 2:
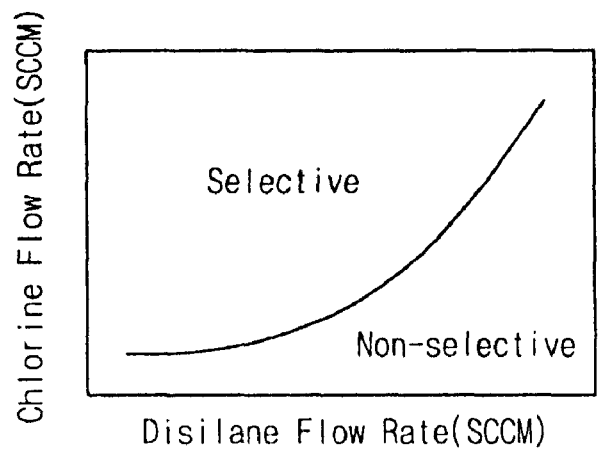
FIG. 2 is a diagram for schematically exhibiting variation in selectivity of epitaxial growth according to a flow rate of $Cl_2$ gas in a conventional method of selective epitaxial growth.
Figure 3:
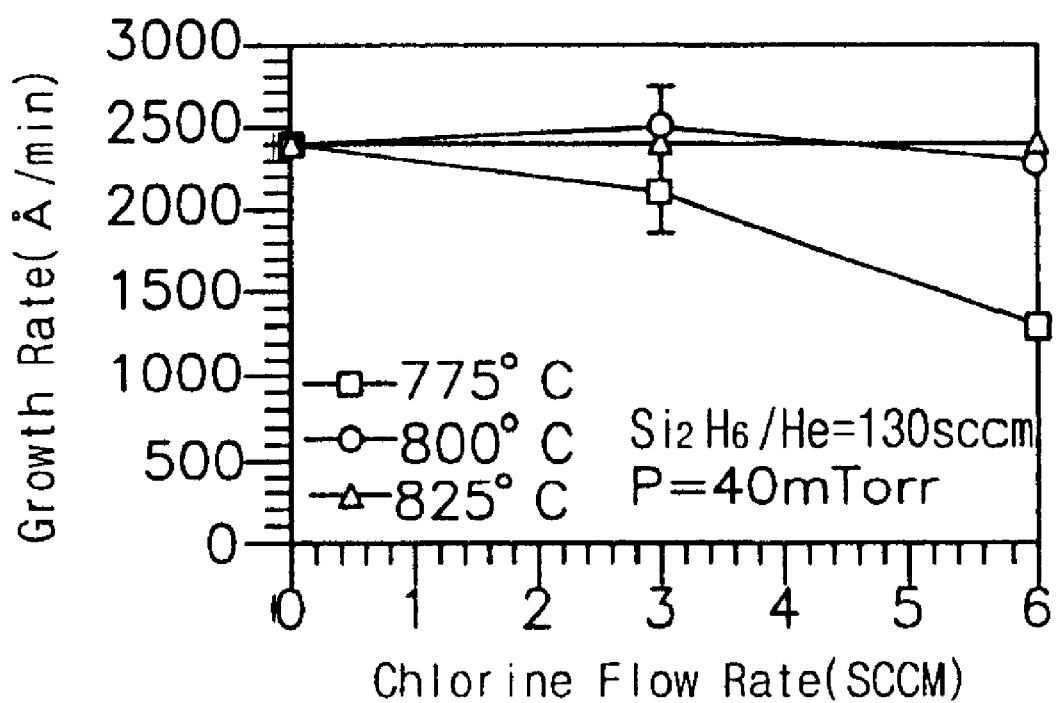
FIG. 3 is a diagram for schematically exhibiting the relation between flow rate of $Cl_2$ gas and growth rate of an epitaxial layer in a conventional method of selective epitaxial growth.
Figure 4:
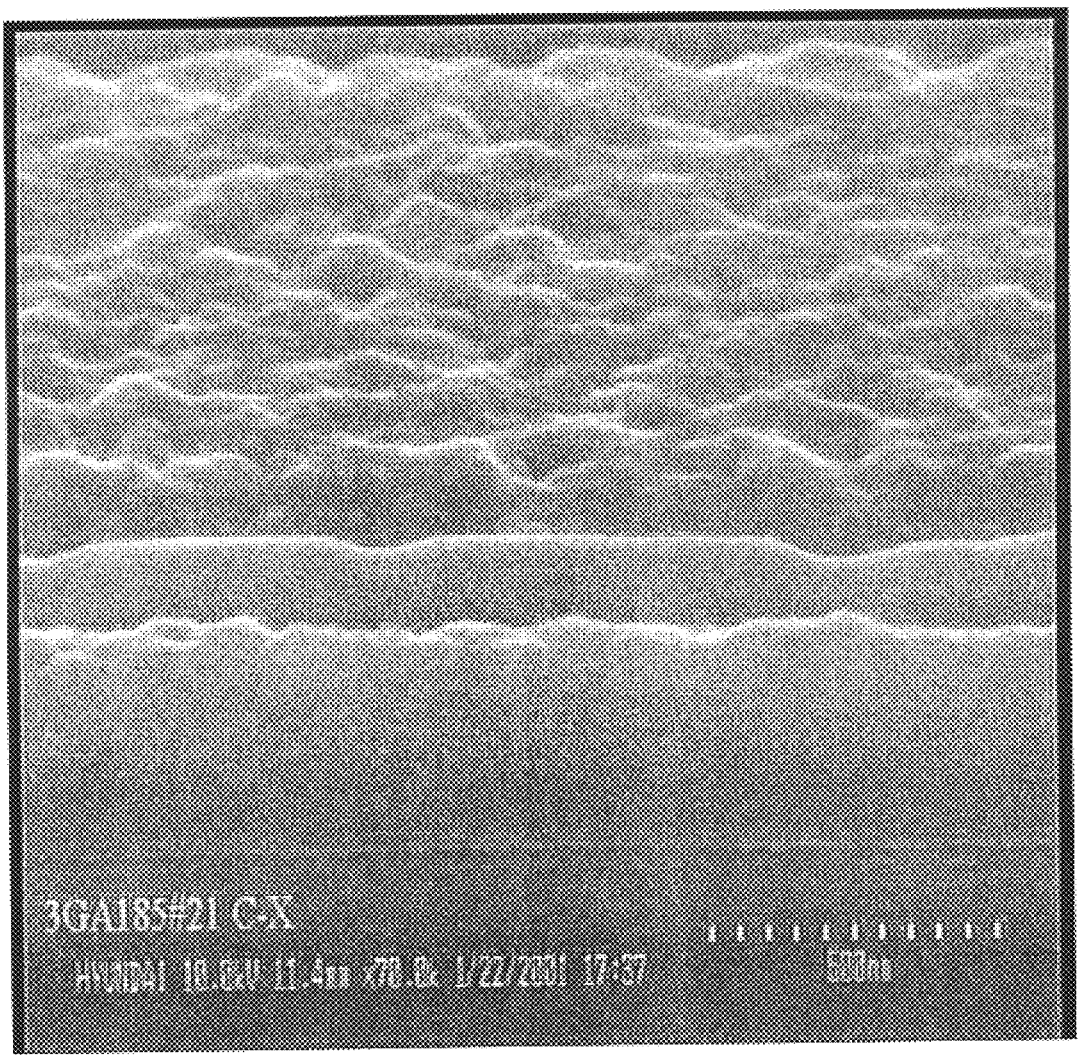
FIG. 4 is a photograph showing an experimental result when a conventional method of selective epitaxial growth is used.
Figure 5:
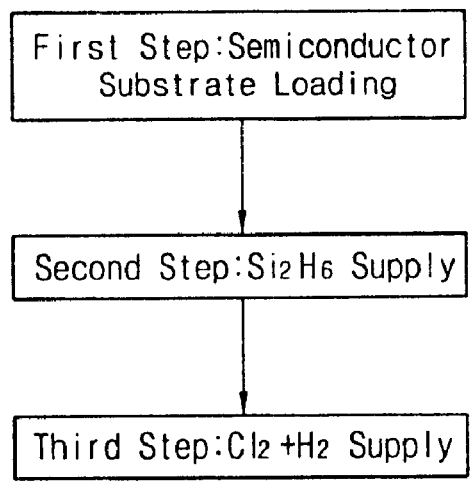
FIG. 5 is a flow chart for schematically illustrating the steps of a method of selective epitaxial growth according to a first embodiment of the present invention.

Referring to FIG. 5, the steps of a method of selective epitaxial growth according to a first embodiment of the present invention are shown. A semiconductor substrate, in and on which prescribed processes are completed, is loaded into a reaction chamber in a first step. On the semiconductor substrate, a mask layer is selectively formed to define a first portion exposed beyond the mask layer and a second portion covered by the mask layer. Preferably, a patterned insulating layer of oxide or nitride is used as the mask layer.

In a second step, a source gas is supplied into the reaction chamber. The source gas inside the reaction chamber is adsorbed on the surfaces of the first portion of the semiconductor substrate. Thereby, a semiconductor epitaxial layer is selectively formed on the first portion only. As the source gas, one or more gases may be used among the group comprising $SiCl_4$, $SiH_2Cl_2$, $SiHCl_3$, $SiH_6$, $Si_2H_6$, $GeH_4$, $Ge_2Cl_6$, $GeCl_4$, $GeH_2Cl_2$, and $GeHCl_3$.

Next, in a third step, a selectivity promoting gas, including $H_2$ gas, is supplied into the reaction chamber. The selectivity promoting gas serves to remove one or more nucleus of semiconductor material that has undesirably adhered on the mask layer. More precisely, the $H_2$ gas is adsorbed on a defective site of the mask layer and thus passivates the defective site. Thereby, undesirable nucleus generation of semiconductor material is prevented and the selectivity of the semiconductor epitaxial layer is improved. The selectivity promoting gas preferably has $Cl_2$ gas as well as $H_2$ gas, both of which are simultaneously supplied into the reaction chamber.

Thereafter, the second and third steps are sequentially repeated until the semiconductor epitaxial layer is grown to a desired thickness. In each step, process time and gas flow rate can be independently regulated.

Figure 6:
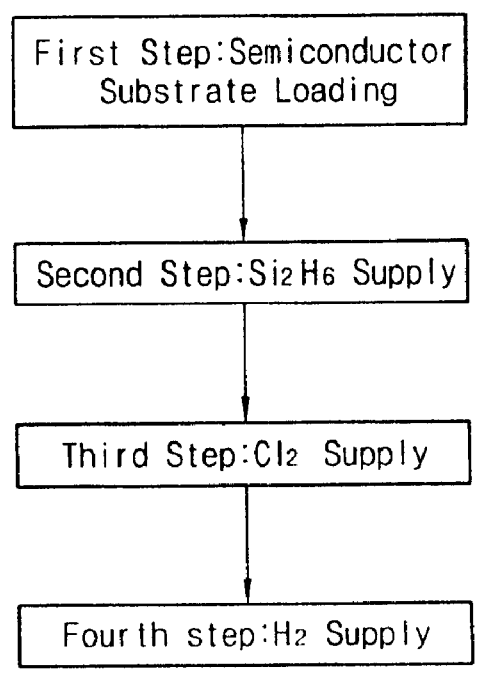
FIG. 6 is a flow chart for schematically illustrating the steps of a method of selective epitaxial growth according to a second embodiment of the present invention.

FIG. 6 schematically shows the steps of a method of selective epitaxial growth according to a second embodiment of the present invention. As shown in FIG. 6, a semiconductor substrate is loaded into a reaction chamber in a first step after predetermined processes are carried out in and on the semiconductor substrate. Especially, the semiconductor substrate has a mask layer, which has been selectively formed to define two portions on the semiconductor substrate. While a first portion is exposed beyond the mask layer, a second portion is covered by the mask layer. As a preferred mask layer, a patterned insulating layer of oxide or nitride is used.

Next, a second step is to supply at least one source gas including silicon or germanium into the reaction chamber. Since the source gas in the reaction chamber is adsorbed on surfaces of the first portion of the semiconductor substrate, a semiconductor epitaxial layer is selectively formed on the first portion only. From the group comprising $SiCl_4$, $SiH_2Cl_2$, $SiHCl_3$, $SiH_6$, $Si_2H_6$, $GeH_4$, $Ge_2Cl_6$, $GeCl_4$, $GeH_2Cl_2$, and $GeHCl_3$, one or more gases may be used as the source gas.

Thereafter, two kinds of selectivity promoting gases are supplied into the reaction chamber in separate steps. That is, $Cl_2$ gas is supplied first as the selectivity promoting gas in a third step, and then $H_2$ gas is supplied as the selectivity promoting gas in a fourth step. Alternatively, it is possible that the $H_2$ gas is supplied first and the $Cl_2$ gas is then supplied. The selectivity promoting gas serves to remove any nucleus of semiconductor material, which may have undesirably adhered to the mask layer, thereby enhancing the selectivity of the semiconductor epitaxial layer.

Next, the second, third and fourth steps are sequentially repeated until the semiconductor epitaxial layer is grown to a desired thickness. In each step, process time and gas flow rate can be independently regulated.

Figure 7:
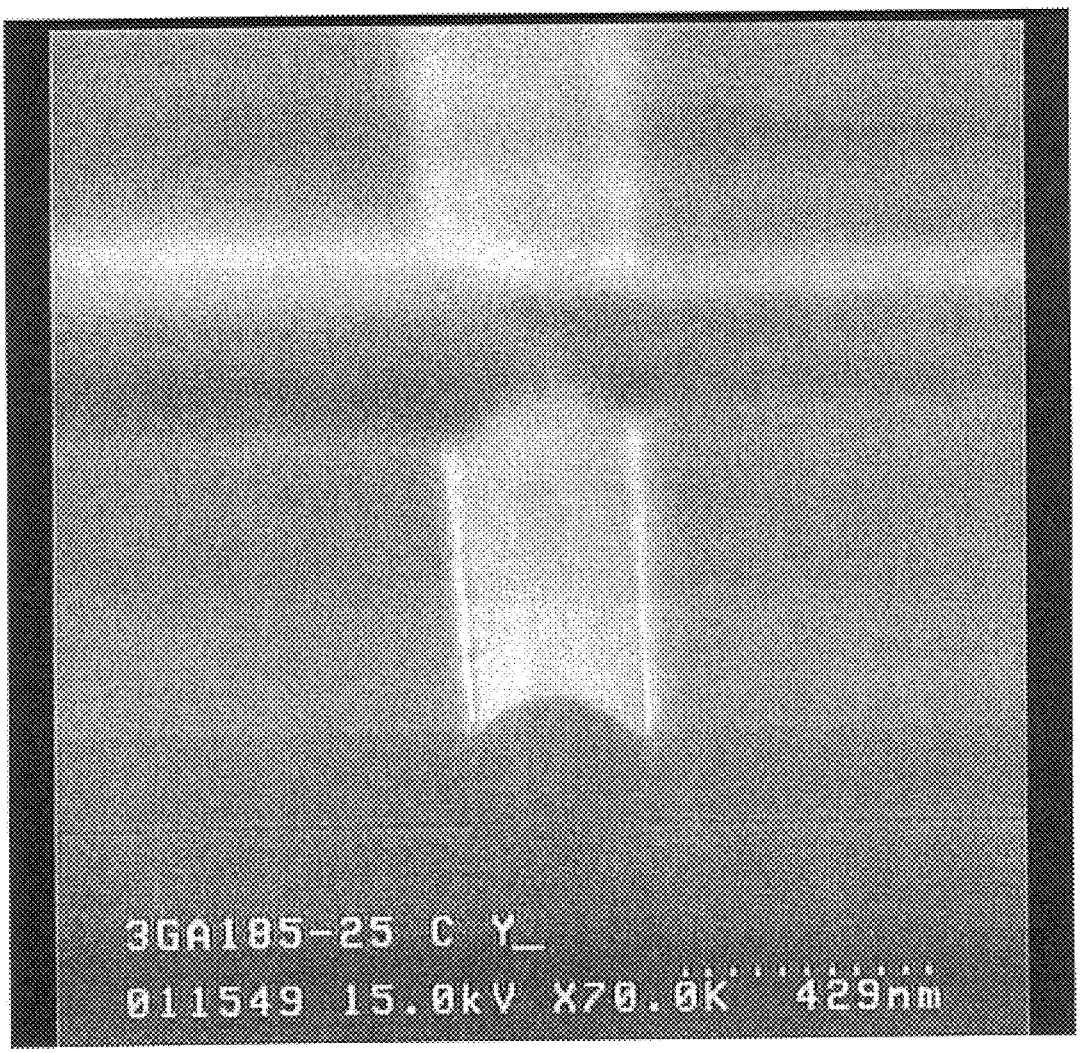
FIG. 7 is a photograph showing an experimental result obtained when the steps of the method according to the second embodiment, shown in FIG. 6, are used.

In regard to the method of the selective epitaxial growth according to the second embodiment of the present invention, FIG. 7 shows an experimental result obtained under conditions of a $Si_2H_6$ source gas supplied with a flow rate of 10 sccm for about ten seconds in the second step, $Cl_2$ gas supplied with a flow rate of 2 sccm for about twelve seconds in the third step, and then $H_2$ gas supplied with a flow rate of 25 sccm for about twelve seconds in the fourth step.

As supported by the experimental result shown in FIG. 7, the addition of the hydrogen gas as the selectivity promoting gas results in the improvement of selectivity.

As fully described hereinbefore, a method of selective epitaxial growth for a semiconductor device according to the present invention has the following advantages and effects.

By the method of the present invention, the additionally supplied hydrogen gas is adsorbed on the defective site of the mask layer and thus passivates the defective site. Thereby, undesirable nucleus generation of polysilicon or silicon germanium on the mask layer is effectively prevented.

Moreover, this causes an increase in selectivity of the semiconductor epitaxial layer. Additionally, though a relatively smaller amount of the chlorine gas is used, the selectivity can be guaranteed by the addition of the hydrogen gas and further the degradation of the gate oxide layer can be prevented.

Furthermore, higher growth rates of the selective epitaxial layer are obtained in spite of a smaller flow rate of the chlorine gas, therefore productivity can be considerably improved.

Besides, since the use of the chlorine gas as a toxic gas can be minimized, the method of the present invention provides the added advantages of safety, reduced environmental pollution, and prolonged life span of facilities in the fabrication process.

In the drawings and specification, there have been disclosed typical preferred embodiments of the invention. Although specific terms are employed, they are used in a generic and descriptive sense only and not for purposes of limitation, the scope of the invention being set forth in the following claims.

What is claimed is:

1. A method of selective epitaxial growth for a semiconductor device, comprising the steps of:

loading a semiconductor substrate into a reaction chamber, wherein a mask layer is selectively formed on the semiconductor substrate to define a first portion exposed beyond the mask layer and a second portion covered by the mask layer;

selectively forming a semiconductor epitaxial layer on the first portion by supplying a source gas into the reaction chamber so that the source gas is adsorbed on the first portion of the semiconductor substrate;

supplying a selectivity promoting gas, including $H_2$ gas and $Cl_2$ gas, into the reaction chamber; and sequentially repeating the steps of supplying the source gas and the selectivity promoting gas, whereby the semiconductor epitaxial layer is grown to a desired thickness.

2. The method of claim 1, wherein the source gas is at least one gas selected from the group consisting of $SiCl_4$, $SiH_2Cl_2$, $SiHCl_3$, $SiH_6$, $Si_2H_6$, $GeH_4$, $Ge_2Cl_6$, $GeCl_4$, $GeH_2Cl_2$, and $GeHCl_3$.

3. The method of claim 1, wherein the supplying step of the selectivity promoting gas includes supplying the $H_2$ gas and the $Cl_2$ gas simultaneously.

4. The method of claim 1, wherein the supplying step of the selectivity promoting gas includes supplying first the $Cl_2$ gas and then supplying the $H_2$ gas.

5. The method of claim 1, wherein the supplying step of the selectivity promoting gas includes supplying first the $H_2$ gas and then supplying the $Cl_2$ gas.

6. A method of selective epitaxial growth for a semiconductor device, comprising the steps of:

loading a semiconductor substrate into a reaction chamber, wherein a mask layer is selectively formed on the semiconductor substrate to define a first portion exposed beyond the mask layer and a second portion covered by the mask layer;

selectively forming a semiconductor epitaxial layer on the first portion by supplying at least one source gas, including silicon or germanium, into the reaction chamber so that the source gas is adsorbed on the first portion of the semiconductor substrate;

supplying a selectivity promoting gas, including $H_2$ gas and $Cl_2$ gas, into the reaction chamber; and sequentially repeating the steps of supplying the source gas and the selectivity promoting gas, whereby the semiconductor epitaxial layer is grown to a desired thickness.

7. The method of claim 6, wherein the source gas including silicon or germanium comprises one or more gases selected from the group consisting of $SiCl_4$, $SiH_2Cl_2$, $SiHCl_3$, $SiH_6$, $Si_2H_6$, $GeH_4$, $Ge_2Cl_6$, $GeCl_4$, $GeH_2Cl_2$, and $GeHCl_3$.

8. The method of claim 6, wherein the supplying step of the selectivity promoting gas includes supplying the $H_2$ gas and the $Cl_2$ gas simultaneously.

9. The method of claim 6, wherein the supplying step of the selectivity promoting gas includes supplying first the $Cl_2$ gas and then supplying the $H_2$ gas.

10. The method of claim 6, wherein the supplying step of the selectivity promoting gas includes supplying first the $H_2$ gas and then supplying the $Cl_2$ gas.

* * * * *